(12) United States Patent
Shun'ko

(10) Patent No.: US 6,259,102 B1
(45) Date of Patent: Jul. 10, 2001

(54) DIRECT CURRENT GAS-DISCHARGE ION-BEAM SOURCE WITH QUADRUPOLE MAGNETIC SEPARATING SYSTEM

(76) Inventor: Evgeny V. Shun'ko, 3032 B Signature Blvd., Ann Arbor, MI (US) 48103

( * ) Notice: Subject to any disclaimer, the term of this patent is extended or adjusted under 35 U.S.C. 154(b) by 0 days.

(21) Appl. No.: 09/315,560

(22) Filed: May 20, 1999

(51) Int. Cl.$^7$ ................ H01J 37/08; H05H 1/54
(52) U.S. Cl. ................ 250/423 R; 315/111.21; 315/111.81; 315/111.91; 313/359.1; 313/361.1; 313/362.1
(58) Field of Search ............ 250/423 R; 315/111.21, 315/111.81, 111.91; 313/359.1, 362.1, 361.1

(56) References Cited

U.S. PATENT DOCUMENTS 4,862,032 * 8/1989 Kaufman et al. ............ 313/359.1
5,945,781 * 8/1999 Valentian ................ 315/111.81

OTHER PUBLICATIONS

Advanced Energy Industries, Inc. New Ion–Beam Source Family of Products (no date).
Advanced Energy Industries, Inc. 12 cm Multi–Cell Ion Source (MCIS): Simplified Design Increases Reliability (Jul. 1998).

* cited by examiner

Primary Examiner—Bruce C. Anderson
Assistant Examiner—Nikita Wells
(74) Attorney, Agent, or Firm—Carothers & Carothers

(57) ABSTRACT

The present invention pertains to steady-state Ion-Beam Sources with an Anode Layer provided by a quadrupole magnetic system formed by a pair of long conductive magnets having U-shape cross-sections and positioned symmetrically above and along a plane and the long anode of nonmagnetic material. The conductive magnets of the quadrupole magnetic system serve as cathodes having an invariable discharge gap with the anode surface faced to the poles of the magnetic system having an invariable magnetic gap defining the width of the generated Ion Beam. The operating configuration of the Ion-Beam Source also comprises a gas-distributing system providing a uniform gas distribution into the gas-discharge gap, an anode water-cooling system (the anode bar has special holes), and a cathode water-cooling system. The Ion-Beam Source may be designed in a long linear style with a quasi-closed and closed electron drift, and in a round style with a closed electron drift. The Ion-Beam Source with a Quadrupole magnetic system can be applied for industrial surface-treatment technologies. A special electric screen may be provided which surrounds the anode and is biased negatively to enable one to generate an electron beam accompanying the ion beam and compensate the outflow of electric charges with the ion beam. This modification of the Ion-Beam Source can be applied as a thruster for space technology and as an instrument for an ion-beam treatment of insulators (glass, ceramic, plastics etc.) and semiconductors.

7 Claims, 8 Drawing Sheets

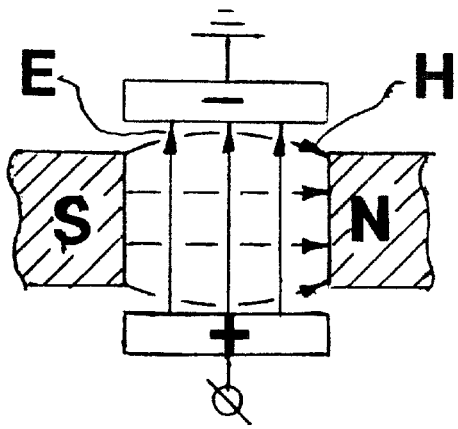
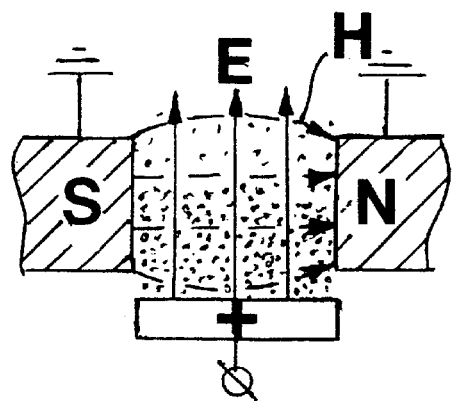
Fig. 3(a)   Fig. 3(b)
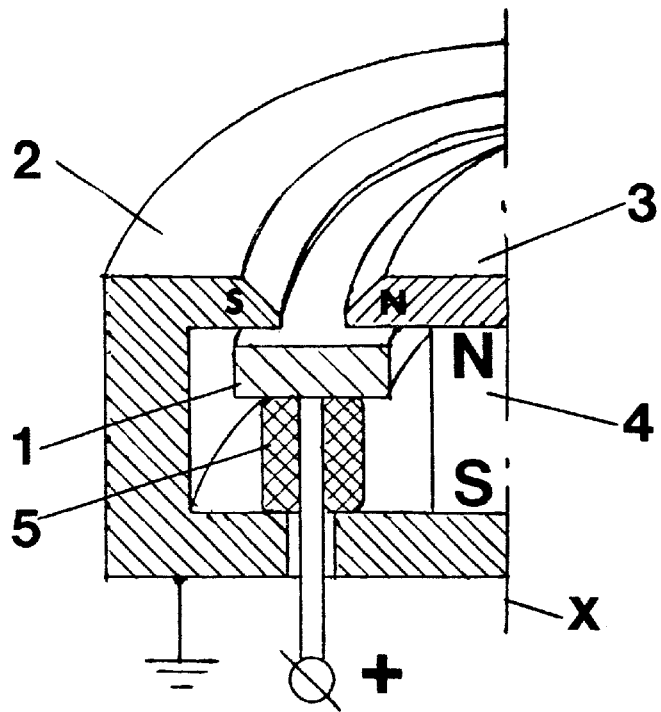
Fig. 3
Prior Art

DIRECT CURRENT GAS-DISCHARGE ION-BEAM SOURCE WITH QUADRUPOLE MAGNETIC SEPARATING SYSTEM

FIELD OF THE INVENTION

The present invention is related to a direct current steady-state gas-discharge Ion-Beam Source of Anode Layer type (IBSAL) for application as an ion thruster in space technology and for application in various kinds of plasma processing technology. More specifically, the present invention is related to a direct current gas-discharge Ion-Beam Source of Anode Layer type with a quadrupole magnetic system trapping an operating plasma and separating the ions from the electrons in a gas-discharge plasma produced by a quasi-closed (or closed) electron drift into crossed electric E and magnetic H fields.

BACKGROUND OF THE INVENTION

Direct current gas discharge Ion-Beam Sources with a Magnetic Layer (IBSML) and with an Anode Layer (IBSAL) are widely used in space and in an ion-beam processing technology: as thrusters in the space technology (IBSML), and as ion-beam sources in Protective Over-coats, In-situ Cleaning, Ion-assisted Deposition, Optical Coatings, Enhanced Sputtering, etc. in industrial ion beam processing technologies (IBSML, IBSAL).

These families of Ion-Beam Sources offer a simplicity in design and maintenance, increased reliability at a decreased maintenance cost, long life (theoretically an infinitesimally long life) with application of a commercially available power supply. The cross-section of an Ion-Beam Source with an Anode Layer is shown schematically in FIG. 3. It comprises a planar long anode 1 of a conductive non-magnetic material mounted on a magnetoconductor 2 of low-carbon steel by insulators 5, two long magnetoconductive poles 3, and a continuation of the magnetoconductor 2 positioned symmetrically above and along the anode 1 with a permanent discharge gap between the anode surface and the poles and with a permanent magnetic gap between the mentioned poles, and a permanent magnet 4 positioned between the pole 3 and the magnetoconductor associated with the pole 2.

The operating voltage is applied between the anode 1 and the poles 2, 3 used as a cathodes and grounded in standard applications. The Ion-Beam Source with the cross-section shown in FIG. 3 could be formed of any length. However, both the ends of this Ion-Beam Source should be connected to one another in order to have an uninterrupted closed magnetic gap above an uninterrupted closed anode surface under uninterrupted surfaces of the magnetic poles. This requirement of the closeness of the Ion-Beam Source elements is a consequence of the condition of a closeness of an electron drift in the crossed electrical E and magnetic H fields formed by the surface of the anode 1 together with the surfaces of the poles 2 and 3 serving as the cathodes. Indeed, if one were to form the crossed electrical E and magnetic H fields in accordance with the configuration of the electrodes and poles shown in FIG. 3(a), one can expect the drift of the electrons as it shown in FIG. 2, i. e. along the magnetic gap shown in FIG. 3, because in practice, the presence of the second electrode (cathode) shown in FIG. 3(a) is not necessary if one uses the magnetic poles as the cathode, due to the electric potential of the magnetic poles connection to one another by plasma, see FIG. 3(b).

For a plasma ignition and for a maintenance of plasma uniformity into the magnetic (and electrical) gap, the requirements for the closeness of the electron drift and the requirements for the closeness of the magnetic and the electrical gaps must consequently be followed. These requirements create a certain obvious inconvenience in design and application of the Ion-Beam Sources with an Anode Layer. The second problem is the requirement for applying the magnetoconductor (2 in FIG. 3) as the necessary element of the IBSAL. It is understood that the magnetoconductor significantly increases the weight of the IBSAL and therefore makes it impossible to consider it for space technology, and being fabricated entirely of a low-carbon steel (desirable design), it has high fabrication cost.

The present invention enables one to overcome all these considered problems by replacing the magnetic poles including the magnetoconductor in IBSAL with a corresponding quadrupole magnetic system.

SUMMARY OF THE INVENTION

The present invention pertains to an Ion-Beam Source with an Anode Layer comprising a long plane anode 1 (see FIGS. 1 and 4) mounted on a mounting plate 8 by insulators 5, two long magnets of U-cross-section (formed each of two long flat bars 2, 3 interlaced with permanent magnets 4) positioned symmetrically above and along the anode with an invariable magnetic gap between the magnetic poles of the magnets disposed as a quadrupole system and with the invariable electrical gap between the anode surface and the corresponding surfaces of the magnetic poles 2 facing to the anode 1 serving as cathodes, a gas-distributing system formed by a plurality of holes 9 in stand-off bars 6 serving as a supports for the magnets of the quadrupole system (for example), a cooling system for the anode (shown in FIG. 1 as squared channels into the anode body), and a cooling system for the cathode shown in FIG. 1 in the form of the tubes 7 clamped between the poles of the quadrupole magnetic system (for example). The direction of the Ion Beam propagation is shown in FIG. 1 by the arrows 11.

The configuration of the electric E and magnetic H fields are shown schematically in FIG. 1(a). As is seen from the field diagram presented in FIG. 1(a), the direction of the magnetic field H induced by the upper pair of magnetic poles is opposite to the direction of the magnetic field induced by the near-anode pair of poles, and this direction is reversed at the special point O in FIG. 1(a) where the value of the magnetic field H is equal zero. Therefore one can expect that the direction of the electron drift velocity will be opposite in the vicinity of the upper pair of magnetic poles in comparison with the near-anode vicinity, see FIG. 2. One can expect also that the electron component of the gas-discharge plasma will be trapped at the vicinity of the point (axis for FIG. 4) O and will deliver the electrons into both the vicinities (near-anode and at the upper pair of magnetic poles) by diffusion. The possibility of the electrons drifting in opposite directions into the different vicinities of the quadrupole magnetic system together with the reconnection of the electron trajectories between the vicinities by the electron diffusion could be considered as a quasi-closed electron drift providing high plasma uniformity. The long life of the trapped electrons provides a significant improvement in plasma ignition and maintenance.

The magnetic field between the poles of the conventional magnetic system, see FIG. 3(b), has a maximum at the point of system symmetry, and the value of this magnetic field is decreased from this point toward the anode as well as toward the opposite direction. Therefore the plasma electrons into the conventional magnetic system should have a gradient magnetic drift leading to loss in electrons. The quadrupole magnetic system has a zero value of magnetic field at the point of magnetic system symmetry (point O in FIG. 1(a)), and the value of the magnetic field in this system is increased in any direction from this point. Therefore the plasma electrons are trapped into the quadrupole magnetic system providing better conditions for the ignition, generation, and maintenance of uniform plasma. As is seen from the comparison of FIGS. 1 and 4 with FIG. 3, the quadrupole magnetic system does not need any heavy steel magnetoconductor for creation of the proper magnetic field, and stand-off bars 6 (FIGS. 1 and 4) could be designed of a non-magnetic material of a low specific weight (aluminum or titanium alloys). Thus the Ion-Beam Source of the present invention with an Anode Layer and a Quadrupole magnetic system could be considered as a thruster in competition with Ion-Beam Sources with Magnetic Layers.

BRIEF DESCRIPTION OF THE DRAWINGS

FIG. 3 is a schematic representation showing a vertical cross-section of a curved portion of the typical Prior Art Ion Bea Source with an Anode Layer.

FIG. 3(a) is a schematic representation showing a formation of the crossed electric E and magnetic H fields by the electrodes (cathode and anode) and magnetic poles for the structure of FIG. 3.

FIG. 3(b) is a schematic representation showing a diagram of the crossed electric E and magnetic H fields in the case where magnetic poles serve as the cathodes electrically reconnected to one another by plasma through a magnetic gap for the prior art structure of FIG. 3.

DESCRIPTION OF PREFERRED EMBODIMENTS

Figure 1:
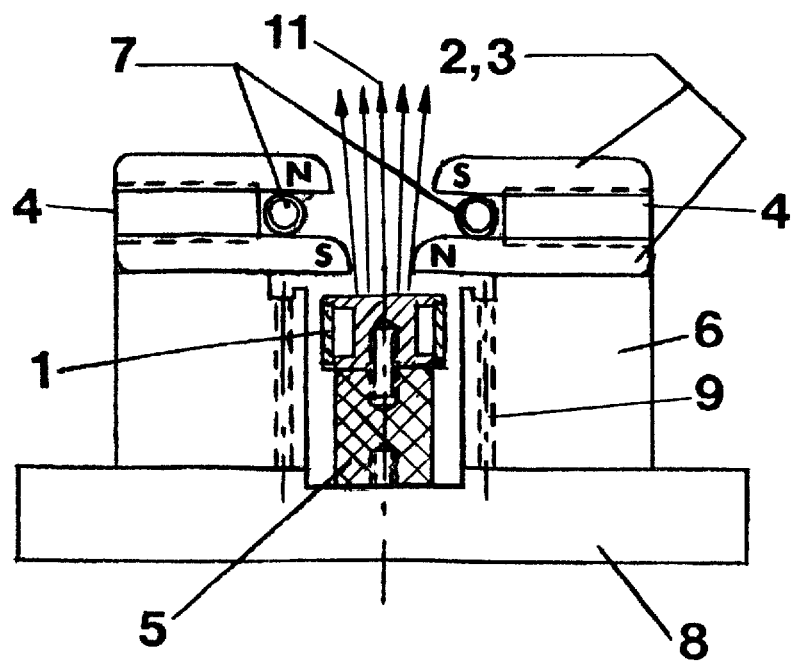
FIG. 1 is a schematic representation showing a footprint of the Ion-Beam Source with an Anode Layer and with the Quadrupole magnetic system of the present invention with the anode and anode insulator shown in cross-section.
Figure 1A:
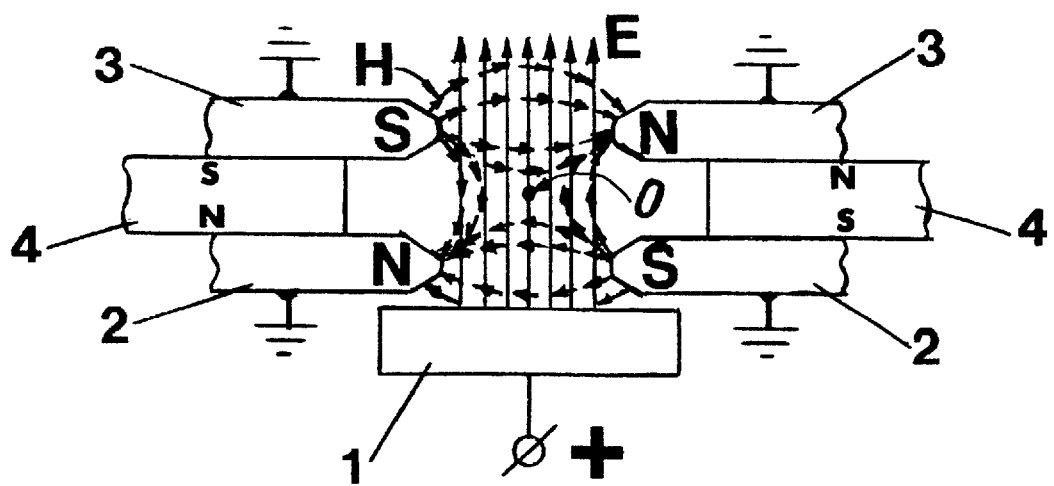
FIG. 1(a) is a schematic representation showing the electric field E and magnetic field H diagram for the Ion-Beam Source with an Anode Layer and with the Quadrupole magnetic system shown in FIG. 1.
Figure 1B:
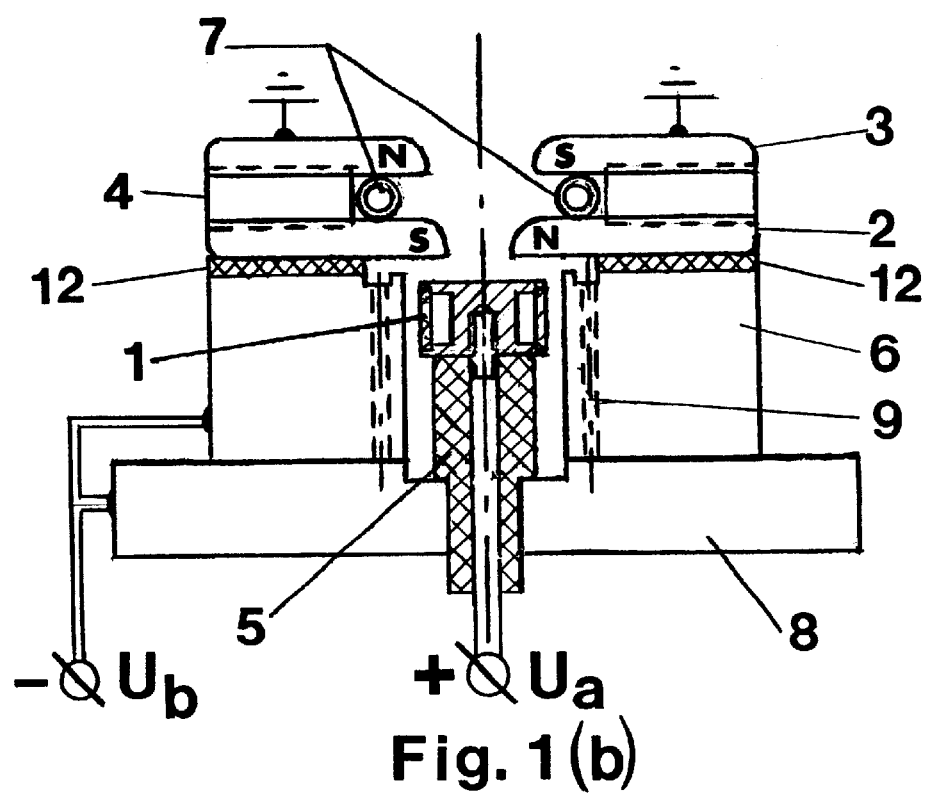
FIG. 1(b) is a schematic representation showing the Ion-Beam Source with an Anode Layer and with the Quadrupole magnetic system of FIG. 1 with metallic parts surrounding the anode, and with stand-off bars 6 and mounting plate 8 supplied by the special negative bias $U_b$.
Figure 2:
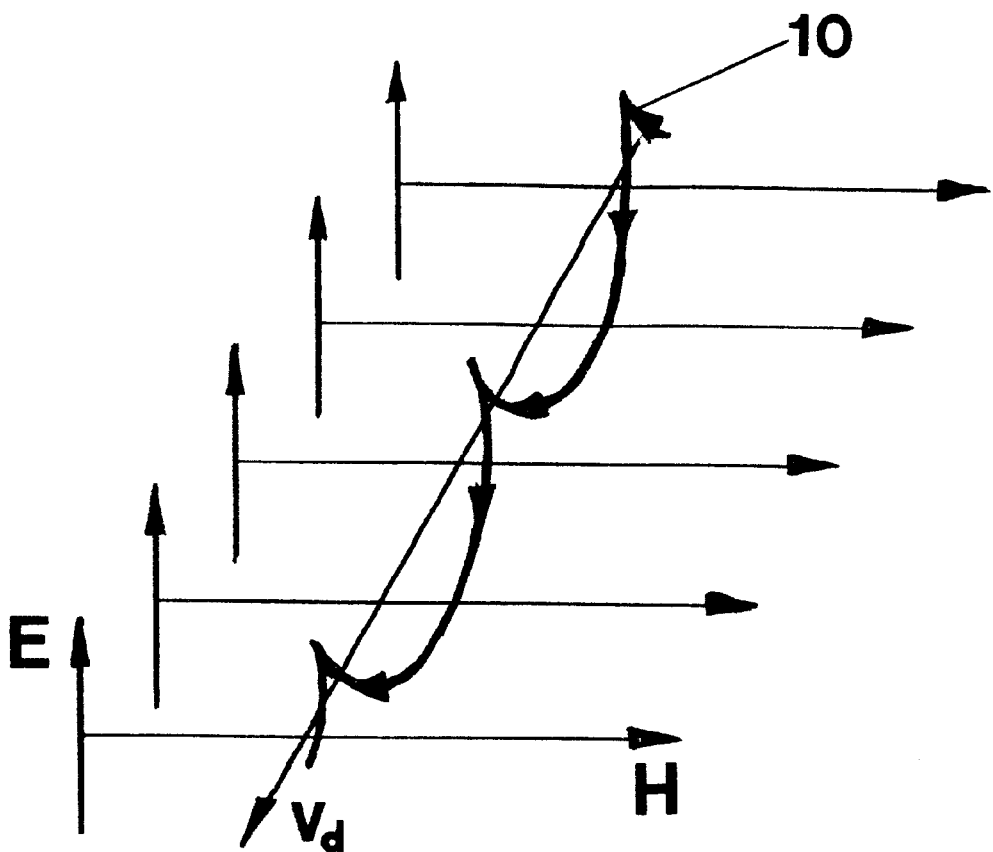
FIG. 2 is a schematic representation showing an electron drift trajectory 10 in the crossed electric E and magnetic H fields for the structures illustrated.
Figure 4:
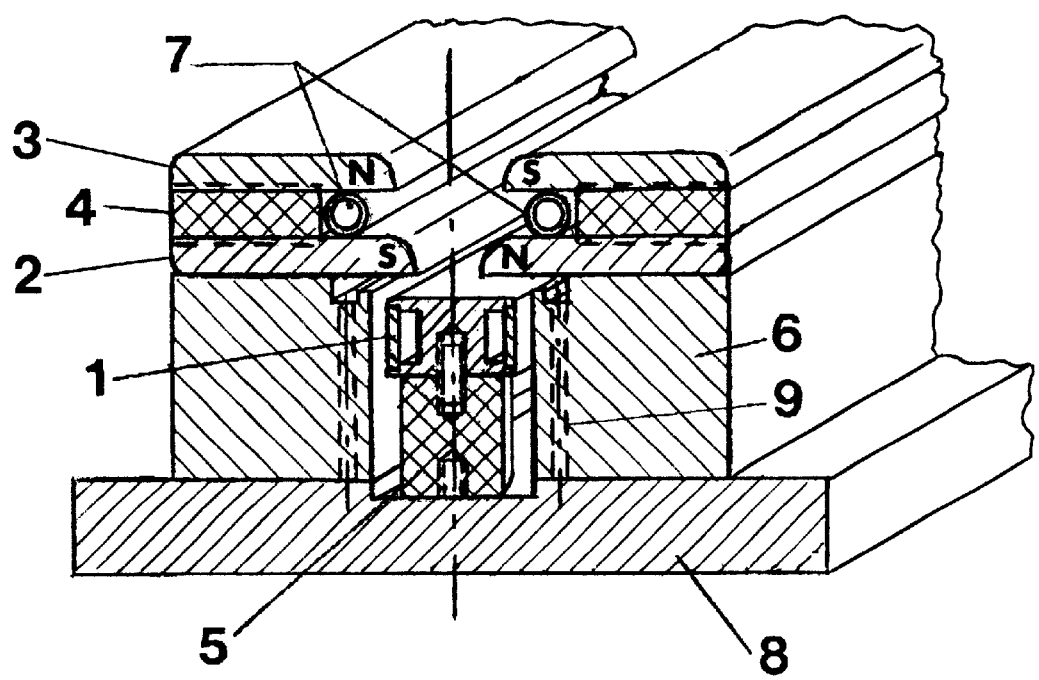
FIG. 4 is a schematic representation showing a sectioned fragment of a linear style of the Ion-Beam Source with an Anode Layer and with a Quadrupole magnetic system providing quasi-closed electron drift in accordance with the teachings of the present invention.

A variety of Ion-Beam Sources with an Anode Layer and a Quadrupole magnetic system can be considered as embodiments of the present invention. The simplest is shown in FIGS. 1 and 4 where the Ion-Beam Source is comprised of the long flat anode 1 of a conductive non-magnetic material mounted to the mounting plate 8 by stand-off insulators 5, two long U-cross-section magnets (comprised of two long flat magnetic poles 2, 3 of low-carbon steel interlaced by permanent magnets 4) positioned symmetrically along and above the anode with an invariable magnetic gap between magnetic poles forming a quadrupole magnetic system and with invariable electrical (discharge) gap between the anode surface and the surfaces of the magnetic poles facing to the anode and serving as a cathodes, two stand-off bars 6 mounted symmetrically from both the sides of the anode on the mounting plate 8 with a purpose to provide uniform gas distribution into the discharge gap by a plurality of holes 9 drilled in the bars 6 and to support the quadrupole magnetic system, the anode water-cooling system formed by the through-holes into and along the anode body, and the water-cooling system of the cathodes provided by clamping the long pipes 7 between the magnetic poles 2 and 3 ($2_a$, $3_a$ in FIGS. 5(a), 5(b), 5(c) as well).

Figure 5:
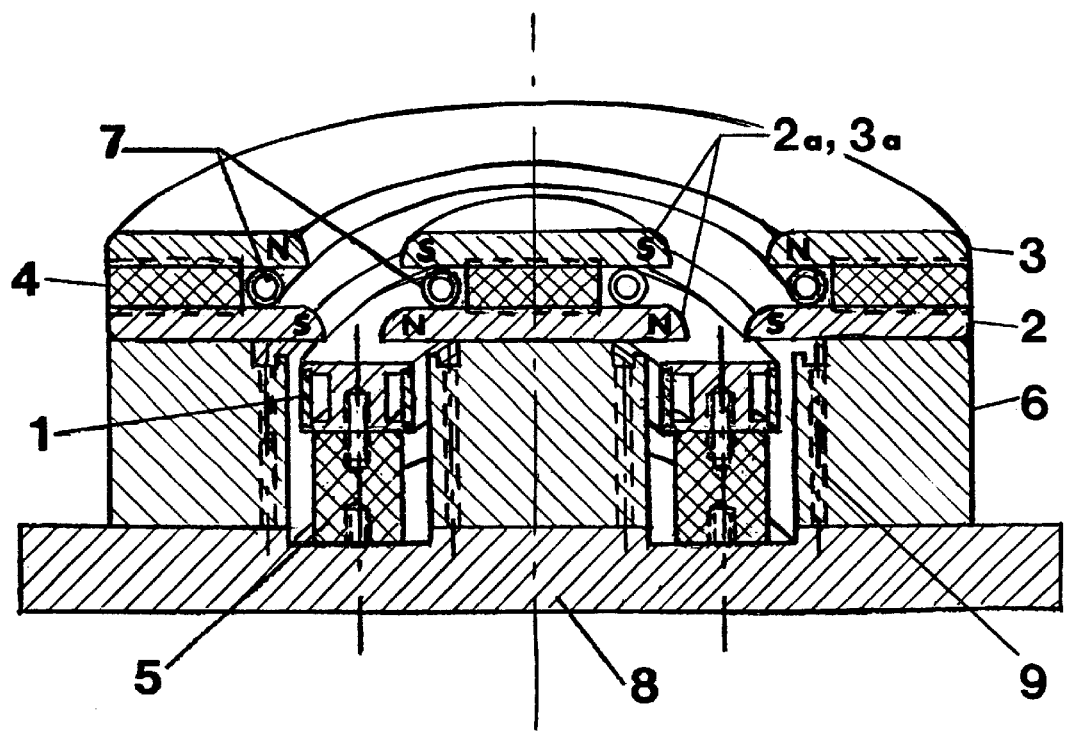
FIG. 5(a) is a schematic representation showing a perspective view and a cross-section of a round style of the Ion-Beam Source with an Anode Layer and with a Quadrupole magnetic system providing closed electron drift in accordance with the teachings of the present invention.
FIG. 5(b) is a schematic representation showing a perspective view of a sectioned fragment of a linear style of the Ion-Beam Source with an Anode Layer and with double magnetic and electrical gaps arranged by Quadrupole magnetic systems providing quasi-closed electron drift in accordance with the teachings of the present invention.
FIG. 5(c) is a schematic representation showing a perspective view and a cross-section of a fragment of a round style of the Ion-Beam Source with an Anode Layer and with double magnetic and electrical gaps arranged by Quadrupole magnetic systems providing closed electron drift in accordance with the teachings of the present invention.
Figure 5:
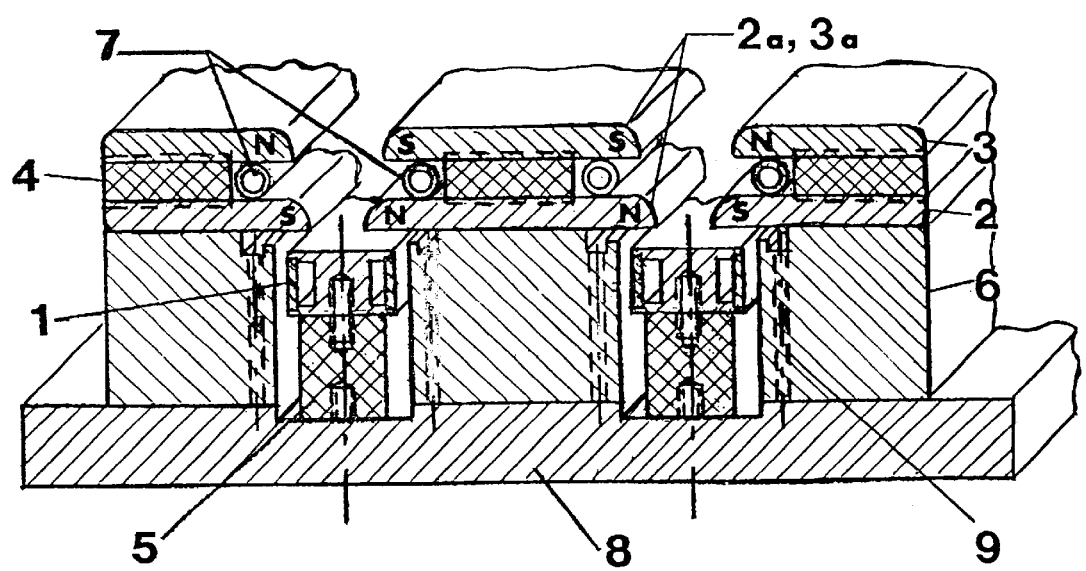
Figure 5C:
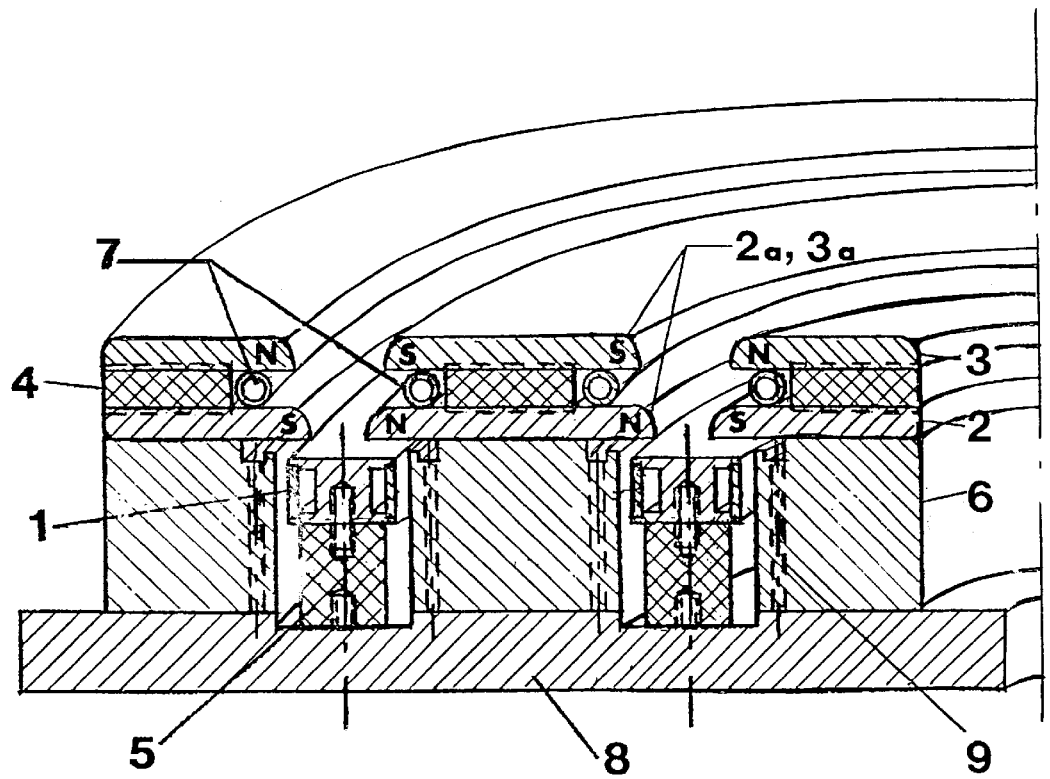

Technological conditions can assume annular geometry of the Ion-Beam Source. For this purpose, both the ends of the long style of the Ion-Beam Source can be connected to one another by geometrical curving the Ion-Beam Source around the axis parallel to and off the axis of the Ion-Beam Source symmetry. The Ion-Beam Source of the round style obtained by this geometrical procedure is shown in FIG. 5(a).

The technological conditions can require treating the large surface area with a quasi-uniform Ion Beam of corresponding cross-section. To form the large cross-section Ion Beam, a plurality of the linear style Ion-Beam Sources, see FIG. 5(b), or a plurality of the round style Ion-Beam Sources, see FIG. 5(c), can be connected to one another. In this case, the magnetic poles of any part of the previous quadrupole magnetic system can be continued to be the magnetic poles for part of the next quadrupole magnetic system, $2_a$ and $3_a$ in FIGS. 5(b), (c).

The technological and physical conditions can require a closed electron drift along a magnetic gap of the Ion-Beam Source of a linear style. In this case, two portions of the round style Ion-Beam Source shown in FIG. 5(a) can be connected to the ends of the linear style Ion-Beam Source shown in FIG. 5(b) to obtain one uninterrupted magnetic gap and one uninterrupted electrical discharge gap providing a reliable closed electron drift.

Thus, the application of the quadrupole magnetic system to the Ion-Beam Source with an Anode Layer increases flexibility of the Ion-Beam Source in design and application, and includes designs assuming closed electron drift.

Experimental testing of the Ion-Beam Source with the Anode Layer and Quadrupole magnetic System has shown that this type of Ion-Beam Source has two operating modes: High Voltage at Low Current, and Low Voltage at High Current that is absolutely similar to the operating modes of the Ion-Beam Sources with the Anode Layer and a Conventional magnetic system shown schematically in FIG. 3. However the scaling of the Ion-Beam Current for Ion-Beam Sources with the Quadrupole system has been approximately three times more at the same gas condition and the same sizes of magnetic and discharge gaps. The experiments have shown also that application of a small controllable electric bias, ~100 V, to the metallic parts surrounding the anode, stand-off bars 6 and mounting plate 8 in FIG. 1(*b*), enable one to completely compensate the ion beam current on some metallic target by the accompanying electron beam current. To disconnect electrically the stand-off bars 6 and mounting plate 8 from the quadrupole magnetic system serving as cathode, the special insulators, 12 in FIG. 1(*b*), were inserted between the stand-off bars 6 and the magnetic poles 2 serving as cathodes. This useful feature of the modified Ion-Beam Source shown in FIG. 1(*b*) enables one to realize Ion-Beam Processes on the surfaces of insulators without collecting the ion charge on these surfaces with further ion-beam blanking. This feature enables one to use the modified Ion-Source shown in FIG. 1(*b*) as a thruster for space technology where loss of the ion charge by the uncompensated ion beam leads to further ion-beam blanking.

What is claimed is:

1. An Ion-Beam Source with an Anode Layer comprising:

a mounting plate;

a planar long anode of conductive nonmagnetic material mounted on said mounting plate by insulators;

a quadrupole magnetic system including two long conductive magnets of a U-shaped cross-section positioned symmetrically above and along said anode with an invariable discharge gap between said anode surface and surfaces of said magnet faced to said anode and with invariable magnetic gaps between poles of said two magnets disposed to form said magnetic quadrupole system while serving simultaneously as cathodes; and a gas system uniformly distributing an operating gas serving as a gas-discharge medium for production of ions forming a beam directed from said anode surface and passing said magnetic gaps of said quadrupole magnetic system.

2. The Ion-Beam Source as recited in claim 1 wherein each of said long conductive magnets of said U-shape cross-section is comprised of a pair of low carbon steel bars interlaced by permanent magnets and thereby forming said long U-shape cross-section magnets of said quadrupole magnetic system.

3. The Ion-Beam Source as recited in claim 1 wherein opposite ends of said Ion-Beam Source are connected to one another through a geometrical curving of all elements of said Ion-Beam Source around an axis which is parallel with and offset from a cross section of said Ion-Beam Source, and the cross-section of said Ion-Beam Source remains invariable throughout its geometrical curving transformations.

4. The Ion-Beam Source as recited in claim 3 wherein said Ion-Beam Source has axial symmetry.

5. The Ion-Beam Source as recited in claim 1 wherein a plurality of said Ion-Beam Sources are mounted in parallel to one another and wherein each pair of adjacent magnets is combined to provide a common magnet for said quadrupole systems.

6. The Ion-Beam Source as recited in claim 1 wherein a plurality of said Ion-Beam Sources are mounted concentrically one around another and wherein each adjacent pair said magnets is combined as a common magnet for said quadrupole systems.

7. The Ion-Beam Source as recited in claim 1 wherein an electrical nonmagnetic screen is mounted around said anode, excluding said anode surface faced to said cathodes and to said magnetic gaps, and said electrical screen is supplied with a negative controllable bias adjusted to have a completely electrically compensated ion beam whereby an outflow of the electron charges is equal to the outflow of the ion charges from said Ion-Beam Source.

* * * * *